United States Patent [19]

Koike

[11] Patent Number: 4,586,163
[45] Date of Patent: Apr. 29, 1986

[54] MULTI-BIT-PER-CELL READ ONLY MEMORY CIRCUIT

[75] Inventor: Hideharu Koike, Yokohama, Japan

[73] Assignee: Toshiba Shibaura Denki Kabushiki Kaisha, Japan

[21] Appl. No.: 510,225

[22] Filed: Jul. 1, 1983

[30] Foreign Application Priority Data

Sep. 13, 1982 [JP] Japan .................... 57-158145

[51] Int. Cl.[4] .................. G11C 7/00; G11C 11/40
[52] U.S. Cl. ............................. 365/104; 365/184
[58] Field of Search ........................ 365/104, 184

[56] References Cited

U.S. PATENT DOCUMENTS 4,107,548 8/1978 Sakaba et al. .................. 365/104
4,202,044 5/1980 Beilstein et al. ................. 365/104

FOREIGN PATENT DOCUMENTS 56-47572 2/1982 Japan .

OTHER PUBLICATIONS

Patent Abstracts of Japan, vol. 6, No. 18, Feb. 2, 1982.
Kawagoe et al., "Minimum Size ROM Structure Compatible with Silicon-Gate E/D MOS LSI," IEEE Journal of Solid-State Circuits, vol., SC-11, No. 3, Jun. 1976.

Primary Examiner—James W. Moffitt
Attorney, Agent, or Firm—Finnegan, Henderson, Farabow, Garrett & Dunner

[57] ABSTRACT

A data memory circuit is provided including a plurality of depletion type MOS transistors connected in series, each of which stores data including two bits in the form of a threshold voltage. One end of the memory circuit is kept at a power source level and the second terminal thereof is kept at a ground potential level. 0 V is applied to the gate electrode of one selected MOS transistor while the power source voltage is applied to the gate electrodes of the remaining MOS transistors. As a result, a voltage equal to an absolute value of the threshold voltage of the selected MOS transistor is produced at the second terminal. A converter converts the voltage produced at the second terminal into corresponding binary coded data.

4 Claims, 7 Drawing Figures

MULTI-BIT-PER-CELL READ ONLY MEMORY CIRCUIT

BACKGROUND OF THE INVENTION

The present invention relates to a read only memory (ROM) circuit including metal oxide semiconductor field effect transistors (MOSFET's), and more particularly, to a multi-bit-per-cell ROM circuit in which multi-bit data are stored in each of the MOS transistors making up the ROM circuit.

A memory device of this type is described in "Two-Bits-Per-Cell ROM", M. Stark, Intel Israel Ltd., which was disclosed in "Computer Conference 1981" (p. 209 to p. 212). Each of the MOSFET's used in this ROM, which is constructed as an OR type ROM, is so designed that the ratio W/L of the channel width W to the channel length L changes according to the information to be stored in the MOSFET. However, this OR-type ROM is inferior to an AND-type ROM with respect to its density of integration when fabricated. Nevertheless, the AND-type ROM has never been employed for the multi-bit-per-cell ROM circuit, because if the memory circuit were of the AND-type, it would be difficult to read out the data stored therein.

An AND-type ROM circuit in which one bit is stored in each cell has been known, as shown in FIG. 1. In FIG. 1A, a memory circuit 1 is constructed with a series circuit including memory cells M10 to M13. The memory cells M10 and M12 as enhancement mode n-channel MOS transistors are respectively supplied at the gate electrodes with gate voltages V0 and V2. The memory cells M11 and M13 as the depletion mode n-channel MOS transistors are supplied at the gate electrodes with voltages V1 and V3, respectively. It is assumed that data "0" is stored in the enhancement mode MOS transistors M10 and M12, and data "1" in the depletion mode MOS transistors M11 and M13. An enhancement mode p-channel MOS transistor M14 is connected between a first terminal 2 as a node of the memory circuit 1 and a first power source $V_{cc}$. An enhancement mode n-channel MOS transistor M15 is inserted between a second terminal 3 as a node and a second power source $V_{ss}$. The node 2 is connected to an input terminal of an inverter 4. The inverter 4 is made up of an n-channel MOS transistor M16 and a p-channel MOS transistor M17 connected in series between the power sources $V_{ss}$ and $V_{cc}$. Data is derived from an output terminal 5 as a connection point between the source-drain paths of the MOS transistor M16 and those of the MOS transistor M17. A clock pulse $\bar{\phi}$ is supplied to the gate electrodes of the MOS transistors M14 and M15. In order to read out the data "0" stored in the MOS transistor M12, the gate voltage V2 of the MOS transistor M12 is set to 0 V (an OFF state), and the gate voltages V0, V1 and V3 of the remaining MOS transistors, are set to the first power source $V_{cc}$. Then, at time To the clock pulse $\bar{\phi}$ is changed from 0 level to $V_{cc}$ level (FIG. 1B). Upon the level change, the MOS transistor M14 is OFF, the MOS transistor M15 is ON, and the MOS transistor M12 is OFF. Accordingly, the node 2 is kept at $V_{cc}$ level and the output terminal 5 is kept at "0" level. In other words, the data "0" stored in the MOS transistor M12 is produced from the output terminal 5. For reading out the data "1" of the MOS transistor M11, the gate voltage V1 is set to 0 V and the remaining gate voltages V0, V2 and V3 to $V_{cc}$. Then, at time To, the clock pulse $\bar{\phi}$ is changed from 0 V to $V_{cc}$. The MOS transistors M10 to M13 and M15 are then ON, while the MOS transistor 14 is OFF. Accordingly, the node 2 is at $V_{ss}$ and the data "1" is derived from the output terminal 5. In this way, the data "1" stored in the MOS transistor M11 is read out. As already stated, the ROM constructed with the logic circuit including the AND type memory circuit 1, as shown in FIG. 1A, has an excellent integration density. In this ROM, it was impossible to store multi-bit data in each of the MOS transistors constituting the ROM, since the ROM is of the current-detection type in which the data is detected depending on the presence or absence of current flow in the memory circuit. Moreover, the ROM using the OR type logic circuit requires contact holes corresponding to each of the MOS transistors forming memory cells, resulting in an increase of the chip area. For these reasons, there has been a great desire for a multi-bit-per-cell ROM circuit which uses an AND-type logic circuit and is capable of storing a plurality of bits in each of the memory cells.

SUMMARY OF THE INVENTION

Accordingly, an object of the present invention is to provide an AND-type multi-bit-per-cell ROM circuit.

According to the present invention, there is provided a multi-bit-per-cell ROM circuit comprising: a memory circuit including a plurality of series-connected depletion mode MOS transistors each of which stores data including at least two bits in the form of a threshold voltage; first connecting means for connecting a first terminal of the memory circuit to a first power source; second connecting means for connecting a second terminal of the memory circuit to a second power source; addressing means which applies a zero voltage to the gate electrode of one selected depletion mode MOS transistor, applies the first power source voltage to the gate electrodes of the remaining depletion mode MOS transistors, and produces at the second terminal an output voltage equal to an absolute value of the threshold voltage of the selected depletion mode MOS transistor; and converting means for converting the output voltage into binary coded data.

With such an arrangement, the data to be stored in a single MOS transistor can be increased. Therefore, the multi-bit-per-cell ROM circuit arranged according to the present invention has a large memory capacity.

DETAILED DESCRIPTION OF THE PREFERRED EMBODIMENTS

Figure 1A:
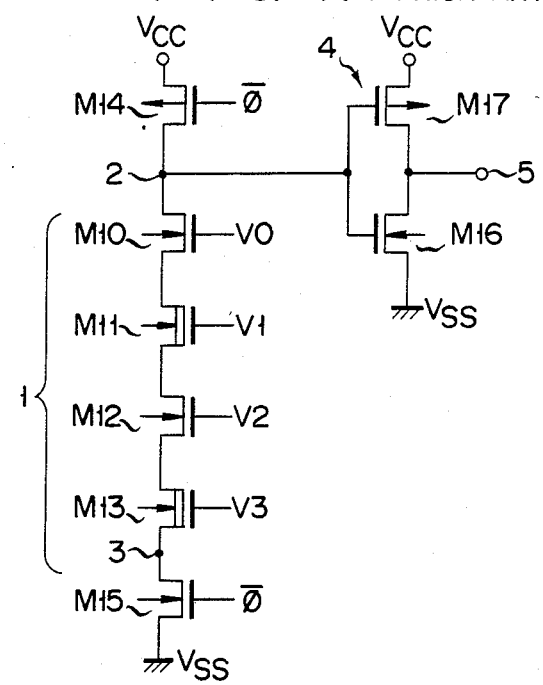
FIG. 1A shows a connection diagram of a prior art AND type one-bit-per-cell ROM circuit containing MOS transistors serially connected and used as memory cells.
Figure 1B:
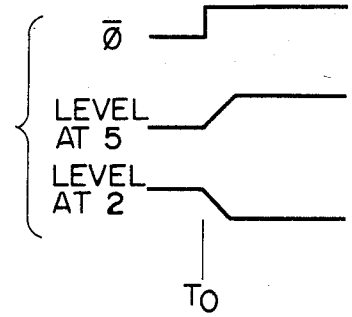
FIG. 1B shows a timing diagram useful in explaining the read operation from the ROM circuit shown in FIG. 1A.
Figure 2:
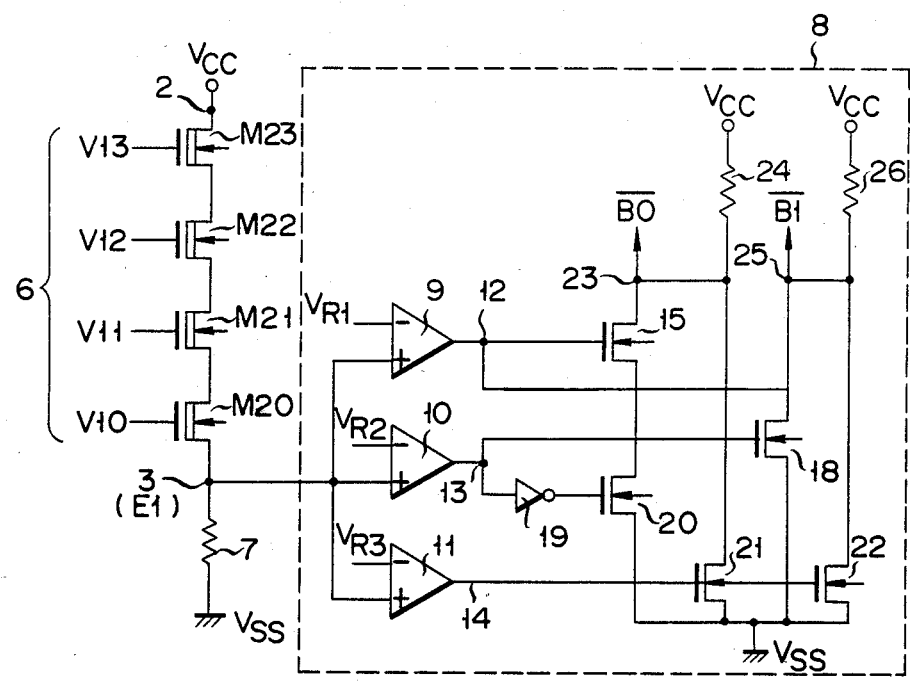
FIG. 2 shows a circuit diagram of an embodiment of the present invention.

In FIG. 2, a memory circuit 6 is composed of depletion mode n-channel MOS transistors M20 to M23 which are connected in series. The threshold voltages of the MOS transistors M20 to M23 are set at $-0.2$ V, $-1.2$ V, $-2.2$ V and $-3.2$ V, respectively. These transistors M20 to M23 store data including two bits "00", "01", "10", and "11", respectively. Gate voltages V10 to V13 are applied to the gate electrodes of the MOS transistors M20 to M23, respectively. A first terminal 2 as node of the memory circuit 6 is directly connected to the first power source $V_{cc}$ (for example, 5 V). A second terminal 3 as a node is connected through a resistor 7 to the second power source $V_{ss}$ (ground potential). The node 3 is connected to an input terminal of a converter 8 for converting a voltage appearing at the node 3 into data including two bits. The converter 8 contains differential amplifiers 9 to 11, whose positive (+) input terminals are commonly connected to the node 3. Reference voltages $V_{R1}$ to $V_{R3}$ are respectively applied to the negative input terminals of the differential amplifiers 9 to 11. The reference voltage $V_{R1}$ is set at a predetermined value between 0.2 V and 1.2 V, the reference voltage $V_{R2}$ between 1.2 V and 2.2 V, and the reference voltage $V_{R3}$ between 2.2 V and 3.2 V. An output node 12 of the differential amplifier 9 is connected to the gate electrode of an n-channel MOS transistor 15. An output node 13 of the differential amplifier 10 is connected to the gate electrode of an n-channel MOS transistor 18 and, through an inverter 19, to the gate electrode of an n-channel MOS transistor 20. An output node 14 of the differential amplifier 11 is connected to the gate electrodes of n-channel MOS transistor 21 and 22. The source-drain paths of the MOS transistors 20, 21, 18 and 22 are connected at their first ends to the second power source $V_{ss}$. The second end of the source-drain path of the n-channel MOS transistor 20 is connected, through the source-drain path of the n-channel MOS transistor 15, to a first data-output terminal 23. The second end of the source-drain path of the n-channel MOS transistor 21 is connected via a resistor 24 to the first power source $V_{cc}$ and also to the first data-output terminal 23. The second end of the source-drain path of the MOS transistor 18 is connected to a second data-output terminal 25. The second end of the source-drain path of the MOS transistor 22 is connected through a resistor 26 to the first power source $V_{cc}$, and further, to the second data-output terminal 25.

Figure 3:
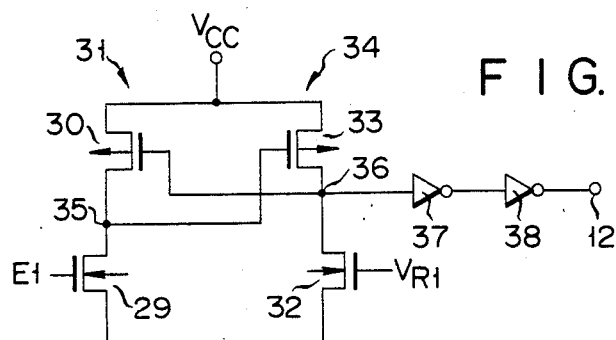
FIG. 3 shows a circuit diagram of a differential amplifier included in the converter which is shown in FIG. 2 and converts an input voltage to corresponding binary coded data.

The structures of the differential amplifiers 9 to 11 are exactly the same, and hence, only the structure of the differential amplifier 9 will be described referring to FIG. 3. In the figure, a first inverter 31 and a second inverter 34 are connected between the second power source $V_{ss}$ and the first power source $V_{cc}$, through an n-channel MOS transistor 28. The first inverter 31 is made up of an n-channel MOS transistor 29 and a p-channel MOS transistor 30. The second inverter 34 is made up of an n-channel MOS transistor 32 and a p-channel MOS transistor 33. An output node 35 of the first inverter 31 is connected to the gate electrode of the p-channel MOS transistor 33. An output node 36 of the second inverter 34 is connected to the gate electrode of the MOS transistor 30. The voltage of the first power source $V_{cc}$ is applied to the gate electrode of the MOS transistor 28. The voltage E1 on the node 3 of the memory circuit 6 is applied to the gate electrode of the MOS transistor 29 and the reference voltage $V_{R1}$ is applied to the gate electrode of the MOS transistor 32. The voltage on the output node 36 of the second inverter 34 is applied by way of the inverters 37 and 38 to the output node 12 of the differential amplifier 9.

The operation of the ROM circuit including the logic circuit shown in FIG. 2 will now be described. In order to read out two bit data "00" stored in the MOS transistor M20 of the memory circuit 6, the gate voltage V10 of the MOS transistor M20 is set to 0 V and the gate voltages V11, V12 and V13 of the remaining MOS transistors are set to $V_{cc}$. As a result, the MOS transistors M21 to M23 are in a low resistive state. If $V_{cc} = 5$ V, the voltage on the node between the MOS transistors M20 and M21 is approximately 5 V. Thus, the drain of the MOS transistor M20 is set at 5 V and the source voltage of the MOS transistor M20 is set at $[0\ V - V_{thM20}] = [0\ V - (-0.2\ V)]$ where $V_{thM20}$ is the threshold voltage of the MOS transistor M20. No current flows through the path between the first power source $V_{cc}$ and the node 3. Therefore, at this time, the node 3 is fixed at 0.2 V. In other words, 0.2 V, which is equal to the absolute value of the threshold voltage of the MOS transistor M20 whose data is to be read out, appears at the node 3. Since the 0.2 V at the node 3 is smaller than any one of the reference voltages $V_{R1}$ to $V_{R3}$, logical "0" appears at the output nodes 12 to 14. Accordingly, the MOS transistor 20 is on, while the MOS transistors 15, 18, 21 and 22 are OFF. As a result, $\overline{B_0} = $ "1" ($B_0 = $ "0") appears at the first data output terminal 23 and $\overline{B_1} = $ "1" ($B_1 = $ "0") appears at the second data output terminal 25. In this way, the two-bit data "00" stored in the MOS transistor M20 is read out. Here, the $B_0$ indicates the bit at the first place and $B_1$ the bit at the second place.

In the differential amplifier 9, when the voltage at the + terminal is higher than the reference voltage $V_{R1}$, the output node 12 is at logical "1", and in the reverse case, it is at logical "0". This will be described referring to FIG. 3. When the reference voltage $V_{R1}$ is higher than the voltage E1 on the node 3, the potential at the output node 36 of the second inverter 34 tends to approach closer to that of the second power source $V_{ss}$ (ground level) than does the potential at the output node 35 of the first inverter 31. At this time, the MOS transistor 28 is in the ON state. Therefore, the p-channel MOS transistor 30 tends to be in an ON state more than does the p-channel MOS transistor 33. That is, the potential at the node 35 approaches closer to that of the first power source $V_{cc}$ than does the output node 36. Since the potential on the node 35 is applied to the gate electrode of the p-channel MOS transistor 33, the OFF state of the p-channel MOS transistor 33 tends to become even more in the OFF state. In other words, the potential at the output node 36 tends to be closer to the potential $V_{ss}$. This operation is repeated and finally the potential on the output node 36 reaches the $V_{ss}$ level or logical "0". Therefore, the logical level on the output node 12 of the differential amplifier 9 is "0". When the potential E1 on the node 3 in FIG. 3 is larger than the reference voltage $V_{R1}$, the circuit shown in FIG. 3 operates in a reverse way, so that the output node 12 of the differential amplifier 9 provides logical "1". The same operation is true for the other differential amplifiers.

In order to read out the data "01" from the MOS transistor M21, the gate voltage V11 of the MOS transistor M21 is set at 0 V and the gate voltages V10 to V13 of the remaining MOS transistors are set to $V_{cc}$. Then, 1.2 V, equal to an absolute value of the threshold voltage $-1.2$ V of the MOS transistor M21, appears at the output node 3. The 1.2 V is converted into data of "01" in the converter 8. And the first data output terminal 23 provides logical "0" and the second data output terminal 25 provides logical "1". The above operation procedure is correspondingly applied for the read operation of the data "10" and "11" of the MOS transistors M22 and M23.

Figure 4B:
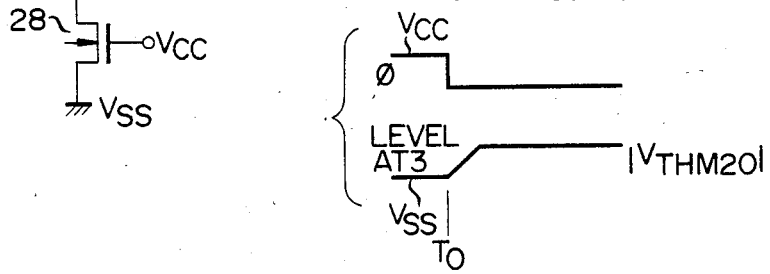
FIGS. 4A and 4B respectively show a circuit diagram of a second embodiment of the invention and a timing diagram useful in explaining the operation of this embodiment.
Figure 4A:
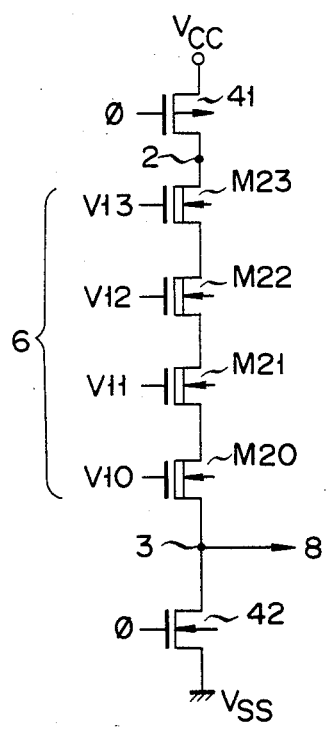

In FIG. 4A illustrating a second embodiment of the invention, only the connection of the memory circuit 6 to the first and second power sources $V_{cc}$ and $V_{ss}$ is illustrated, while omitting the illustration of the converter 8. As shown, an enhancement mode p-channel MOS transistor 41 is connected between the first node 2 and the first power source $V_{cc}$. An enhancement mode n-channel MOS transistor 42 is inserted between the second node 3 and the second power source $V_{ss}$. The clock pulse $\phi$ shown in FIG. 4B is supplied to the gate electrodes of the MOS transistors 41 and 42. In this way, the current flow through the memory circuit 6 is prevented in the read mode and in the non-read mode as well. When the clock signal $\phi$ shown in FIG. 4B is at the $V_{cc}$ level, the enhancement mode p-channel MOS transistor 41 is turned off and the enhancement mode n-channel MOS transistor 42 is turned on, so that the voltage on the node 3 is at $V_{ss}$ level or 0 v. In order to read out the data from the MOS transistor M20, the gate voltage of the MOS transistor M20 is set to 0 V and the gate voltages V11 to V13 of other MOS transistors are set to $V_{cc}$ level. Then, the clock pulse $\phi$ is changed in level to 0 V at time To. At this time, an absolute value $|V_{thM20}| = 0.2$ V of the threshold voltage $-V_{thM20}$ of the MOS transistor M20 appears at the node 3, as described referring to FIG. 3. The 0.2 V is converted into "00" by the converter 8. The reading operation of other MOS transistors has already been described with reference to FIG. 2, and hence the description thereof will be omitted. Since the second embodiment employs the enhancement mode n-channel MOS transistor 42, the data read speed can be increased. When the MOS transistor M20 and the enhancement mode n-channel MOS transistor 42 are the same size, the potential on the node 3 is frequently unstable due to the leak current of the depletion mode n-channel MOS transistor M20. To avoid this, it is preferable to properly limit the leak current of the MOS transistor M20 by designing the enhancement mode n-channel MOS transistor 42 geometrically larger than the MOS transistor M20.

Figure 5:
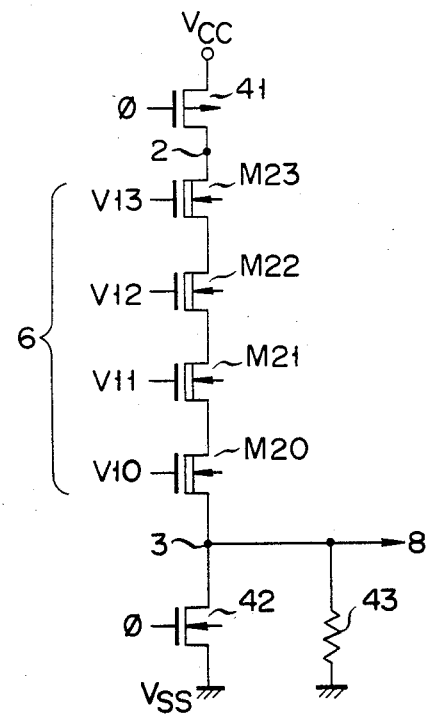
FIG. 5 shows a circuit diagram of a third embodiment of the present invention.

In a third embodiment of the present invention shown in FIG. 5, a resistor 43 is connected in parallel with the enhancement mode n-channel MOS transistor 42 of FIG. 4A. This embodiment eliminates the instability of the potential on the node 3 by pulling the potential of the node 3 to the $V_{ss}$ level by properly selecting the resistance of the resistor 43.

What is claimed is:

1. A multi-bit-per-cell ROM circuit comprising:
   a memory circuit including a plurality of series-connected depletion mode MOS transistors each of which stores data including at least two bits in the form of a threshold voltage;
   first connecting means for connecting a first terminal of said memory circuit to a first power source;
   second connecting means for connecting a second terminal of said memory circuit to a second power source;
   addressing means which applies a zero voltage to the gate electrode of one selected depletion mode MOS transistor, applies said first power source voltage to the gate electrodes of the remaining depletion mode MOS transistors, and produces at said second terminal an output voltage equal to an absolute value of the threshold voltage of said selected depletion mode MOS transistor; and
   converting means for converting said output voltage into binary coded data.

2. A multi-bit-per-cell ROM circuit according to claim 1, in which said first connecting means includes means for directly connecting said first terminal of said memory circuit to said first power source, and said second connecting means includes means for connecting said second terminal of said memory circuit to said second power source through a resistor.

3. A multi-bit-per-cell ROM circuit according to claim 1, in which said first connecting means includes means for connecting said first terminal of said memory circuit to said first power source through an enhancement MOS transistor of first conductivity mode channel, said second connecting means includes means for connecting said second terminal in said memory circuit to said second power source through an enhancement MOS transistor of second conductivity mode channel, wherein, only when data is read out from said memory circuit, a clock pulse to turn on said enhancement MOS transistor of first conductivity mode channel is supplied to the gate electrode thereof and a clock pulse to turn off said enhancement MOS transistor of second conductivity mode channel is supplied to the gate electrode thereof.

4. A multi-bit-per-cell ROM circuit according to claim 3, in which said second connecting means further includes a resistor connected in parallel with said enhancement MOS transistor of second conductivity mode channel.

* * * * *

UNITED STATES PATENT AND TRADEMARK OFFICE
CERTIFICATE OF CORRECTION

PATENT NO. : 4,586,163
DATED : April 29, 1986
INVENTOR(S) : Hideharu Koike

It is certified that error appears in the above-identified patent and that said Letters Patent is hereby corrected as shown below:

Title page:

Please correct the name of the assignee from "Toshiba Shibaura Denki Kabushiki Kaisha" to -- Tokyo Shibaura Denki Kabushiki Kaisha , Kawasaki-Shi, Japan--.

Signed and Sealed this

Twenty-sixth Day of August 1986

[SEAL]

Attest:

DONALD J. QUIGG

Attesting Officer  Commissioner of Patents and Trademarks